United States Patent [19]

Ishizawa

[11] 4,145,627

[45] Mar. 20, 1979

[54] CRIMPED SEAL PIEZOELECTRIC RESONATOR PACKAGE

[75] Inventor: Tadao Ishizawa, Tokyo, Japan

[73] Assignee: Kabushiki Kaisha Daini Seikosha, Japan

[21] Appl. No.: 772,148

[22] Filed: Feb. 25, 1977

[30] Foreign Application Priority Data

Feb. 25, 1976 [JP] Japan ................................. 51-19556

[51] Int. Cl.² ........................................... H01L 41/10
[52] U.S. Cl. ..................................... 310/344; 310/353
[58] Field of Search ......... 310/356, 344, 355, 351–353

[56] References Cited

U.S. PATENT DOCUMENTS

| | | | |
|---|---|---|---|
| 2,341,683 | 2/1944 | Bailey | 310/356 |
| 2,395,034 | 2/1946 | Bokovoy | 310/356 |
| 2,488,781 | 11/1949 | Reeves | 310/344 |

*Primary Examiner*—Mark O. Budd

*Attorney, Agent, or Firm*—Robert E. Burns; Emmanuel J. Lobato; Bruce L. Adams

[57] ABSTRACT

A piezoelectric resonator element having supporting lead members projecting in opposite directions therefrom is positioned in a tubular dielectric case having tubular metal cap members affixed at opposite ends thereof and extruding beyond the ends of the case. Inner end portions of the cap members are hermetically sealed to the case. Intermediate portions of the cap members beyond the ends of the case are compressed onto end portions of the lead members to secure the resonator element in position in the case and to make electrical contact between the lead members and the metal cap members. End portions of the cap members beyond the ends of the lead members are compressed to seal the case, the sealing being effected in a vacuum so as to evacuate the interior of the case. In order further to seal the case, the outer ends of the cap members may be welded or soldered.

9 Claims, 7 Drawing Figures

CRIMPED SEAL PIEZOELECTRIC RESONATOR PACKAGE

FIELD OF INVENTION

The present invention relates to packaging of piezoelectric resonators and in particular the packaging of miniature resonators suitable for watches and the like.

BACKGROUND OF THE INVENTION

A piezoelectric resonator element such as quartz is generally packaged in a vacuum casing in order to avoid any external forces or atmospheric influence that might affect vibration of the resonator. A conventional resonator comprises a quartz fork packaged in a metal case. The quartz fork has a pair of parallel lead wires which extend through a glass base which is fixed airtightly in one end of the case. A resonator packaging of this kind has the fault that if used for a micro resonator the lead wires are apt to touch one another because the gap between them is too small. Moreover the assembling of a resonator packaging of this kind in a watch requires much time because the fine lead wires are easily bent.

In an effort to overcome this fault it has been proposed to package a resonator element in a metal case comprising a flanged trough-like vessel having two holes in its bottom near the ends. The resonator element is provided at opposite ends with lead wires which extend laterally through insulating bases fixed in the holes in the bottom of the vessel. The vessel is then covered with a flanged cover which is welded on in a high vacuum to seal the case. With this type of packaging the lead wires are sufficiently spaced. However the flange area around the vessel body is large in relation to the space inside the vessel so that it is not possible to miniaturize the packaging beyond a limit. Moreover it is difficult to obtain a high vacuum in the case because of gas generation from the pressure welding of the flanges.

SUMMARY OF THE INVENTION

It is an object of the present invention to overcome the faults and disadvantages of prior resonator packaging and to provide a micro resonator packaging for a piezoelectric resonator such as quartz suitable for easy assembly in watches and the like. It is a further object of the invention to provide a micro packaging suitable for mass production at low cost. A further object of the invention is to provide a micro resonator packaging which keeps a high vacuum therein so that sharp resonance can be obtained.

In accordance with the invention a resonator having supporting lead members projecting in opposite directions therefrom is positioned in a tubular dielectric case having an electrically conductive end cap at each end thereof. Each of the caps has a tubular inner end portion sealed to the dielectric case, an intermediate portion into which the respective lead member of the resonator extends and an outer end portion which extends beyond the end of the respective lead member. The intermediate portions of the end caps are pressed inwardly onto the respective lead members so as to securely grip and hold the lead members and to make electrical contact therewith while at the same time closing the case. The case is further sealed by caulking or cold welding the outer end portions of the cap members. If desired the ends of the cap members can thereafter be soldered or heat welded to provide still further assurance of a perfect seal. The sealing is effected under a high vacuum in order to evacuate the interior of the case.

BRIEF DESCRIPTION OF THE DRAWINGS

The nature objects and advantages of the invention will be more fully understood from the following description in conjunction with the accompanying drawings in which.

DESCRIPTION OF PRIOR ART RESONATOR PACKAGING

Figure 1:
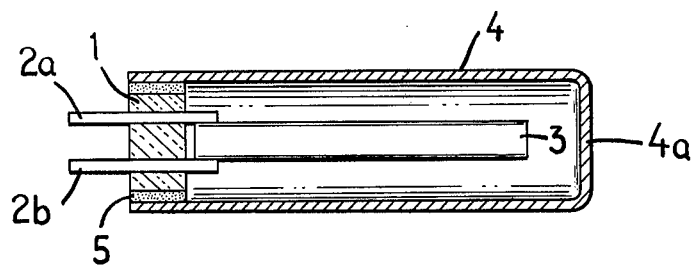
FIG. 1 is a longitudinal sectional view showing a conventional resonator packaging.

In FIG. 1 there is shown a conventional resonator packaging in which a glass base 1 has a pair of lead wires 2a and 2b extending therethrough. An end of each lead wire is electrically and mechanically connected with the base of quartz fork 3. The glass base 1 with the quartz fork 3 thus mounted thereon is then inserted into the open end of a tubular metal case 4 having a closed end 4a and is hermetically sealed in the case by sealing material 5. The sealing is effected in a vacuum so as to evacuate the interior of the case.

A resonator packaging of the kind shown in FIG. 1 has the fault when used for micro resonators that the lead wires 2a and 2b are apt to touch one another because the gap between is too small. Moreover the assembly of a resonator packaging of this kind in a watch requires much time and great care because the fine lead wires are easily bent.

Figure 2:
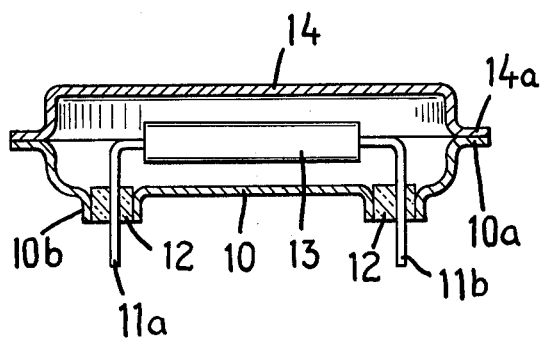
FIG. 2 is a longitudinal sectional view showing another type of conventional resonator packaging.

In FIG. 2 there is shown another conventional resonator packaging in which a metal case comprises a trough-like vessel 10 having a peripheral flange 10a and a dished cover 14 having a peripheral flange 14a. The vessel 10 is provided near its ends with flanged openings 10b in which bases 12 of glass are other insulated material are fitted. A quartz resonator 13 is provided at opposite ends with lead wires 11a and 11b which are bent so as to extend laterally of the resonator through the respective bases 12 in the openings 10b of the vessel 10. After the resonator is thus assembled in the vessel 10 the vessel is closed with the cover 14 in a high vacuum and the flange 14a of the cover is pressure welded to the flange 10a of the vessel 10 so as to form a sealed enclosure.

The resonator packaging shown in FIG. 2 has the advantage over that of FIG. 1 in that the distance between the lead wires is large enough to permit easy connection with external circuitry. However the resonator packaging of FIG. 2 has the disadvantage that the flange area around the casing is large relative to the sealed enclosure so that it is impossible to miniaturize the packaging beyond a certain limit. Moreover it is difficult to keep a high vacuum in the enclosure because of gas generation from the flanges during pressure welding.

DESCRIPTION OF PREFERRED EMBODIMENT

Figure 3:
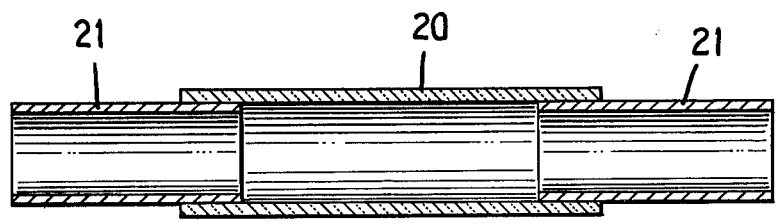
FIG. 3 is a longitudinal sectional view of a dielectric case and conductive cap members affixed at opposite ends thereof for packaging a resonator in accordance with the invention.

A preferred embodiment of a micro resonator packaging in accordance with the present invention will now be described with reference to FIGS. 3 to 6. In accordance with the invention a piezoelectric resonator is packaged in a tubular dielectric case 20 illustrated in FIG. 3. The tubular case 20 is preferably made of a material such as Kover glass including an Fe-Ni-Co alloy. A pair of tubular conductive end caps 21 are respectively fitted to the opposite ends of the tubular dielectric case 20 and project beyond the ends of the case as seen in FIG. 3. The caps 21 are preferably made of a plastic metal such as Kover (Fe-Ni-Co alloy) if the case 20 is made of Kover glass. In any case it is advantageous to select materials having substantially equal thermal expansion coefficient for the case 20 and caps 21. The end caps are hermetically sealed to the tubular case 20 by first oxidizing the outer surfaces of the end caps, inserting the end caps a predetermined distance into the ends of the tubular case 20 and then heating both ends of the tubular case to melt and shrink the glass to obtain a hermetic seal between the case and the end caps. The caps 21 are not only for hermetically closing the case but are used to position and support a resonator in the case and serve as the outer terminals of the resonator as will be described below.

Figure 4:
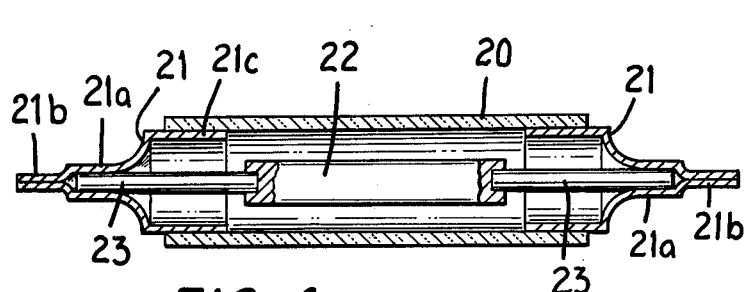
FIG. 4 is a longitudinal sectional view showing a completed resonator packaging in accordance with the invention.
Figure 5:
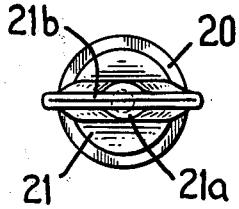
FIG. 5 is an end view of the resonator packaging shown in FIG. 4.
Figure 6:
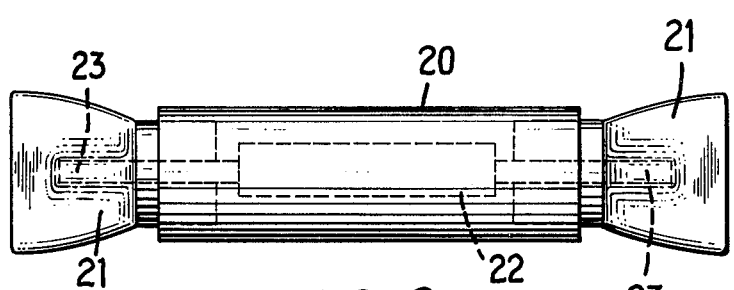
FIG. 6 is a side view of the resonator packaging taken at right angles to FIG. 4
Figure 7:
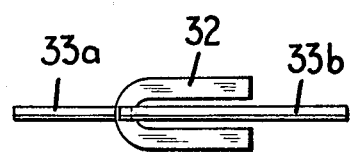
FIG. 7 is a front view showing a fork-type resonator provided with lead members for packaging in accordance with the invention.

FIGS. 4, 5 and 6 show a completed resonator packaging comprising a resonator 22 suspended within the sealed case. For example the resonator 22 may be an AT-cut oblong strip quartz resonator for thickness shear type oscillation. The resonator is provided with a pair of plate type or fine bar type supporting lead members 23 which extend longitudinally from opposite ends of the resonator 22. These lead members 23 support the resonator 22 in the case 20 and electrically connect the electrodes of the resonator with respective end caps 21.

Each of the end caps 21 has a tubular inner end portion 21c which is fixed to the respective end of the dielectric case 20 so as to provide a hermetic seal between the end cap and the case. The lead members 23 of the resonator 22 extend into intermediate portions 21a of the end caps 21 which project beyond the ends of the dielectric case 20 and which are caulked or cold welded onto the lead members 23 with high pressure. The ends of the case are thereby closed and the lead members 23 are securely held so as to suspend the resonator 22 in a desired position in the case. Moreover the lead members 23 are thereby electrically connected with the conductive end caps 21 so that the latter serve as external terminals for the resonator.

Further tip portions 21b of the end caps 21 extend beyond the ends of the lead members 23 and are caulked or cold welded with high pressure further to seal the packaging. The outer portions 21b serve as convenient outer terminals for connecting the resonator into an oscillating circuit.

A preferred manufacturing process for making micro resonator packagings according to the invention will now be described. The lead members 23 are preferably inserted into holes which have been previously made in the resonator 22 and are securely fixed with solder or conductive adhesive. This assembly of the resonator 22 and lead members 23 is placed in the dielectric tubular case 20 having tubular end caps 21 fixed thereto as illustrated in FIG. 3. The case 20 is of a diameter to receive the resonator 22 with suitable clearance and of such length that the lead members 23 of the resonator 22 extend into intermediate portions 21a of the end caps. The end caps are then caulked or cold welded to hermetically close the case and to secure the resonator in selected position in the case. It is advantageous to caulk or cold weld the intermediate portion 21a and tip portion 21b of one end cap 21 to securely hold and position the resonator — lead member assembly in the case under atmospheric conditions. Next the caulking or cold welding of the remaining cap 21 is carried out under high vacuum so as to seal the resonator in a highly evacuated state. Accordingly both of the lead members 23 are fixed to the respective intermediate holding portions 21a of the end caps 21 and both of the tip portions 21d serve for further sealing of the packaging. The caulking or cold welding area is so small that there is very little gas generation to disturb the vacuum in the packaging. In order to provide further assurance of a perfectly hermetic seal, it is preferable to weld or solder the sealing portions 21b after caulking or cold welding.

It may also be possible to caulk or cold weld both of the end caps 21 with the lead members 23 at the same time in a high vacuum. As the intermediate portions 21a of the caps 21 are pressed inwardly from both sides in the caulking or cold welding operation the resonator 22 is thereby correctly positioned in the case 20.

It is to be noted that the resonator is not limited to an AT-cut quartz resonator but that the invention is also applicable in packaging other piezoelectric resonator elements. Thus for example shows a fork type resonator 32 which may be packaged in accordance with the invention. The resonator 32 has a pair of lead bars 33a and 33b which are fixed to opposite faces of the case or base portion thereof and extend longitudinally in opposite directions from the resonator. These lead bars 33a and 33b are received in the conductive end caps 21 at opposite ends of the dielectric case 20 as described above to support and position the resonator in the case and to provide electrical connection to the conductive end caps which serve as external terminals for the resonator. With a fork type resonator it is advantageous to use a case and end caps of oval cross section in order to accommodate the resonator with suitable clearance while keeping the volume of the enclosure and the overall size of the packaged resonator as small as possible.

While preferred embodiments of the invention have been illustrated in the drawings and are herein particularly described it will be understood that the invention is in no way limited to these embodiments since many variations and modifications can be made.

What is claimed is:

1. A resonator packaging comprising a tubular dielectric case, an electrically conductive cap at each end of said case, and a resonator positioned in said case between the ends thereof, said resonator having supporting lead members fixed thereto and projecting respectively into said caps at opposite ends of said case, each of said caps comprising a continuous length of metal tubing having a cylindrical inner end portion sealed to said tubular case, and an intermediate portion and outer end portion projecting beyond the respective end of said case, said outer end portion being pressed flat with a width at least as great as the diameter of said cylindrical inner end portion and hermetically closed to seal said case, the interior of which is evacuated, and said intermediate portion constituting a transition between said cylindrical inner end portion and said flat outer end portion and having opposite sides pressed onto the respective lead member of said resonator securely to grip and hold said lead member to support said resonator and to make electrical contact with said lead member.

2. A resonator packaging according to claim 1, in which said case and said end caps have substantially the same coefficient of thermal expansion.

3. A resonator packaging according to claim 2, in which said case is of Fe-Ni-Co glass and said end caps are of Fe-Ni-Co alloy.

4. A resonator packaging according to claim 1, in which outer end portions of said caps are welded to perfectly seal the packaging.

5. A resonator packaging according to claim 1, in which outer end portions of said caps are soldered to perfectly seal the packaging.

6. A resonator packaging according to claim 1, in which said resonator is an AT-cut oblong strip quartz crystal for thickness shear type oscillation.

7. A resonator packaging according to claim 1, in which said resonator is tuning fork type quartz crystal.

8. A resonator packaging according to claim 1, in which said cylindrical inner end portions of said caps fit into opposite end portions of said tubular case which are shrunk onto said tubular inner end portions of said caps to provide a hermetic seal.

9. A resonator packaging comprising a tubular dielectric case, an electrically conductive tubular cap at each end of said case, a resonator positioned in said case between the ends thereof, said resonator having supporting lead members fixed thereto and projecting respectively into said caps at opposite ends of said case, each of said caps having a cylindrical inner end portion sealed to said tubular case, and an intermediate portion and outer end portion projecting beyond the end of said tubular case, said outer end portion being pressed flat and hermetically closed to seal said case the interior of which is evacuated, and said intermediate portion constituting a transition between said cylindrical inner end portion and said flat outer end portion and having opposite sides pressed onto the respective lead member of said resonator to securely grip and hold said lead member to support said resonator and to make electrical contact with said lead member, said lead member extending only into said intermediate portion of said cap and stopping short of said flat outer end portion of said cap, whereby said flat outer end portion has opposite halves which are pressed against one another throughout their width.

* * * * *